(12) United States Patent
Fafard

(10) Patent No.: US 6,768,754 B1
(45) Date of Patent: Jul. 27, 2004

(54) QUANTUM DOT TUNABLE EXTERNAL CAVITY LASERS (QD-TEC LASERS)

(75) Inventor: Simon Fafard, Orleans (CA)

(73) Assignee: National Research Council of Canada, Ottawa (CA)

( * ) Notice: Subject to any disclaimer, the term of this patent is extended or adjusted under 35 U.S.C. 154(b) by 157 days.

(21) Appl. No.: 09/661,429

(22) Filed: Sep. 13, 2000

(51) Int. Cl.⁷ .......................... H01S 5/00; H01L 29/06; H01L 33/00
(52) U.S. Cl. .................... 372/43; 257/13; 257/17; 257/19; 257/14; 257/21; 257/97
(58) Field of Search ............................ 372/43; 257/17, 257/19, 13, 14, 22

(56) References Cited

U.S. PATENT DOCUMENTS

| | | | | |
|---|---|---|---|---|
| 5,841,152 A | * | 11/1998 | Ishikawa | 257/14 |
| 6,052,400 A | * | 4/2000 | Nanbu et al. | 372/50 |
| 6,177,684 B1 | * | 1/2001 | Sugiyama | 257/17 |
| 6,285,698 B1 | * | 9/2001 | Romano et al. | 372/46 |
| 6,421,363 B1 | * | 7/2002 | Osinski et al. | 372/50 |
| 6,432,471 B1 | * | 8/2002 | Cook | 427/10 |
| 6,541,788 B2 | * | 4/2003 | Petroff et al. | 257/21 |

OTHER PUBLICATIONS

K. Hinzer, et al., "Widely Tunable Self–Assembled Quantum Dot Lasers", J. Vac. Sci, Technol. A 18(2) Mar./Apr. 2000, pp. 578–581.

S. Fafard et al., "Manipulating the Energy Levels of Semiconductor Quantum Dots", Physical Review B, vol. 59, No. 23, Jun. 15, 1999, pp. 15 368–15–373.

S. Fafard et al., "Lasing in Quantum–Dot Ensembles With Sharp Adjustable Electronic Shells", Applied Physical Letters, vol. 75, No. 7, Aug. 16, 1999, pp. 986–988.

* cited by examiner

Primary Examiner—Jerome Jackson
Assistant Examiner—Joseph Nguyen
(74) Attorney, Agent, or Firm—Marks & Clerk (57) ABSTRACT

A laser system includes a laser diode with a low dimensional nanostructure, such as quantum dots or quantum wires, for emitting light over a wide range of wavelengths. An external cavity is used to generate laser light at a wavelength selected by a wavelength-selective element. The system provides a compact and efficient laser tunable over a wide range of wavelengths.

20 Claims, 4 Drawing Sheets

QUANTUM DOT TUNABLE EXTERNAL CAVITY LASERS (QD-TEC LASERS)

FIELD OF THE INVENTION

The present invention relates to the field of photonics, and more particularly to low-dimensionality semiconductor laser devices capable of emitting different frequencies.

BACKGROUND OF THE INVENTION

Presently, very efficient and compact laser sources can be obtained using semiconductor laser diodes based on 2-dimensional quantum well(s) in their active gain region. Such state-of-the-art semiconductor laser diodes can produce hundreds of milliwatts of laser light emitted over a narrow range of wavelengths of a few nanometers (nm) or smaller. Typically, to obtain a different wavelength, a distinct laser diode must be fabricated with the appropriate quantum well(s) in its active region. For several applications, a wide range of wavelengths are necessary. This limits the usefulness of semiconductor laser diodes based on quantum wells because the 2-dimensional density-of-states of the electronic structure results in a gain spectrum which can be tuned at most by tens of nanometers using external cavities, or using integrated tuning elements.

The current state-of-the-art technology used to obtain laser sources tunable over hundreds of nanometers using external cavity configurations with a solid-state crystal such as a Ti-Sapphire lasers (Ti-Saph lasers), or with dyes mixed in a liquid medium (Dye lasers). These lasers have major limitations because they are not compact and are very inefficient since they have to be aligned and optically pumped with another powerful laser operated at shorter wavelengths.

There exists a real need for compact and efficient lasers, tunable over a broad range of wavelengths for multimedia and telecommunication applications, as well as for diagnostic and research/development tools. New applications will also emerge with the development and availability of such laser sources.

It is therefore an object of the invention to provide an apparatus and method capable of generating laser light tunable over a wide range of wavelengths in a compact and efficient way.

SUMMARY OF THE INVENTION

Unlike the density-of-state of bulk material and of quantum wells, the electronic configuration of low-dimensional nano-structures, herein defined as quantum wires (one- or quasi-one dimensional structures) or quantum dots (zero or quasi-zero dimensional structures), will allow the saturation of their reduced density-of-states over a wide range of energies because the total number of available states is orders of magnitude smaller than for quantum wells. This will permit the production of population inversions and lasing over wide range of wavelengths. Also, it is possible to produce Self-Assembled Quantum Dots (QD) by epitaxy using highly strained semiconductors, and to have good 1o control over their zero-dimensional density-of-state. Such quantum dots can be grown in a laser diode configuration with conventional techniques, and the carriers will be injected electrically in the QD laser diode. To obtain the tunability in such a QD laser diode having a wide gain spectrum, an external cavity is used. The resulting QD tunable external cavity (QD-TEC) laser retains the efficiency and convenience of conventional semiconductor laser diodes, and yet is tunable over hundreds of nanometers by choosing the low-dimensional electronic structure of the QD and the optical properties of the external cavity.

Accordingly in a broad aspect the invention provides a laser system comprising a laser diode with low dimensional quantum structures for emitting light over a wide range of wavelengths, a wavelength-selective element for selecting a wavelength of interest emitted by said laser diode, and an external cavity resonant at a wavelength selected by said wavelength-selective element so that the system generates laser light at said selected wavelength.

The wavelength-selective element used to tune the laser output may consist of an a diffraction grating, a prism, a birefringent element, an etalon, or a dispersive element.

One dimensional or quasi-one-dimensional structures can be obtained from coupled zero- or quasi-zero dimensional structures, or from other techniques which can produce quantum wires.

In operation the application of an electric field causes charged-carriers to be injected from contact layers into an active region of a semiconductor heterostructure containing quantum dots or quantum wires. Then photons originating from the radiative recombination of the charged carriers in the active region are emitted. The photons are confined in the cavity designed with tunable wavelength-selective elements which are adjusted to support a lasing output over the selected wavelengths.

The laser diode and the wavelength-selective element are preferably located within the external cavity in such a way that the laser light is emitted from the laser diode passes through the wavelength-selective element and resonates within the external cavity by passing one or several times through the laser diode and the wavelength-selective element, to finally exit out of the external cavity through one or several outputs. In a preferred embodiment the laser diode is a quantum dot (QD) laser diode.

The external cavity may be formed either in part from a facet of the laser diode, and/or in part from the said wavelength-selective element as an output-coupler, and/or from specially designed optical components as high reflectors, and/or folding mirrors, and/or output couplers.

The QD laser diode preferably comprises multiple layers of semiconductor materials including a least one quantum dot layer in an active region between an electron emitter layer, allowing the injection of electrons towards the quantum dots, and a hole emitter layer, allowing the injection of holes towards the quantum dots. The composition and doping of the materials is chosen so that the relative optical constants, bandgaps, and conductivity of the layers establish an effective guiding of the optical modes in a cavity formed perpendicular to the plane of the layers, as well as efficient carrier injection when an electric field is applied with the proper forward-bias polarity.

In the case where multiple quantum dot layers are used in the active region, barriers separate the quantum dot layers. The electron and hole emitter layers are preferably doped n-type and p-type respectively to act as a reservoir of charged carriers and to conduct the current necessary for the operation under bias. The electron and/or hole emitter layers can be composed of several layers or regions to vary the composition and/or doping, to optimize the optical and electrical properties of the QD laser diode.

The active region is preferably not doped to minimize loses of the guided optical modes. Intermediate layers with chosen bandgap and doping can also be introduced between the active region and the emitter layers to tailor the optical guiding and the optical and electrical properties of the laser diode. The current injection and the optical mode guided in the QD laser diode material are preferably confined laterally to tailor the electrical, thermal, and optical characteristic of the QD-TEC laser. The current injection in the QD laser diode material might preferably be confined longitudinally to tailor the electrical, thermal, and optical characteristic of the QD-TEC laser. The longitudinal confinement of the optical mode guided in the QD laser diode material is preferably adjusted by changing the reflectivity of a front and a back facet individually to tailor the electrical, thermal, and optical characteristic of the QD-TEC laser. It might be preferable to regulate the temperature and/or remove excess heat generated by the operation of the QD laser diode with the help of a temperature regulating device.

The wavelength-selective element is preferably designed to be adjustable to a bandpass over the gain spectrum of the QD-TEC laser. For the wavelengths selected in the bandpass, lasing will be achieved from a net optical gain which will be obtained before the photon escape the cavity, whereas the wavelengths outside the bandpass will not lase because the attenuation will be larger than the gain. The selected bandpass can be changed by simply adjusting the wavelength-selective element to obtain lasing at the various wavelengths available from the gain spectrum of the QD-TEC laser. In some embodiments, it might be preferable to build the wavelength-selective tuning element integrated to the QD laser diode.

The external cavity preferably provides the appropriate optical feedback to yield tunable lasing over a large portion of the gain spectrum of the QD laser diode. It may comprise at lease one back mirror and one output coupler but might use more complex configurations with several folding mirrors and/or output couplers to provide the desired optical characteristic and mode profiling functions. In some embodiments, it might be preferable to integrate part of the external cavity into the QD laser diode and/or to the wavelength selective tuning element.

Also, the size/shape of the quantum dots and the number of quantum dots per unit area are adjusted from the growth parameters in conjunction with the choice of quantum dot material, of barrier materials, of the number of quantum dot layers, of external cavity parameters, and of wavelength-selective element to achieve the desired tuning range and while optimizing the lasing efficiency for the wavelengths of interest. Similarly, the choice of the barrier material, the doping profiles, potential height, and barrier thickness is adjusted in conjunction with the quantum dot size to set the gain spectrum of the QD laser diode, to select a balance the laser efficiency and modulation speed, and to achieve the desired growth mode in the self-assembling growth. For multiple layers of quantum dots very thin barriers result in coupled zero-dimensional states in vertically self-organized quantum dots; thicker barriers result in isolated zero-dimensional states in vertically self-organized quantum dots, and thick barriers will result in isolated zero-dimensional states in uncorrelated independent quantum dot layers.

In another aspect the invention provides a method of producing low-dimensionality laser diodes having an adjustable gain spectrum based on a quantum material with low-dimensional density-of-states which relies on self-assembled quantum dots obtained by spontaneous island formation during epitaxy of highly strained semiconductors, comprising selecting a barrier material and a quantum material such that the degree of lattice-mismatch dictates a critical thickness required to obtain spontaneous island formation, and the bandgap difference determines a possible number of confined states in conjunction with the energy spectrum of the low-dimensional states; growing some thickness of said barrier material in an active region between an electron emitting layer and a hole emitting layer on a substrate, said electron and hole emitting layers having a lattice constant close to that of said substrate; depositing, at a specified growth rate, said quantum material at a temperature which will produce quantum dots having the appropriate size and shape to obtain said low-dimensionality density-of-states; ceasing the growth of said quantum material after the desired number of quantum dots per unit area is reached; waiting a specified amount of time to allow for the self-assembling growth to form the quantum dots in shapes and sizes which will give said low-dimensionality density-of-states; and growing some thickness of said barrier material to cover the quantum dots and return to a planar growth front at a substrate temperature which may be varied during the growth and which will optimize the quality of the quantum dots.

In a preferred form of the invention the layers of the semiconductor materials are grown on a substrate from materials consisting essentially of gallium, indium, aluminum, arsenic, phosphorous, and possibly nitrogen, using known techniques such as molecular beam epitaxy, or metalorganic chemical vapor deposition, or chemical beam epitaxy, with dopant such as silicon, beryllium, or others. On GaAs substrates, the quantum dot material can be InGaAs, AlInAs, InP, or other alloys of AlGaInAsP, with barriers of AlGaAs or AlGaInP. On InP substrate, the quantum dot material can be InGaAs. Alloys with nitrogen can be used with the above III–V in cases where different band gap materials are desirable. On group IV substrates, Si can be used for the barrier, with the III–V alloys mentioned above for the quantum dot material. The substrate is needed to give structural integrity to the very thin layers of the QD laser diode and to allow proper crystal growth.

The QD-TEC laser is preferably powered by electrical energy, and lasing at various wavelengths is obtained by adjusting the tuning element with the help of some mechanical components or some electro-optical actuating devices which can be calibrated and/or computerized. The optical characteristic of the output laser beam are preferably adjusted with the parameters of the external cavity. The zero-dimensional density-of-state which dictates the gain spectrum of the QD-TEC laser is controlled from the symmetry and shape of the self-assembled quantum dots which preferably takes a form resembling an hemispherical cap, a lens shape, a disk shape, a pyramidal or truncated and/or rounded pyramid shape. The self-assembled quantum dots are preferably obtained with the spontaneous island formation during the epitaxy of highly strained semiconductor materials. The details of the self-assembling growth are preferably arranged to establish the shape, symmetry, and size of the quantum dots and therefore set the quantum dot energy levels to optimize the lasing in the desired spectral range.

The low-dimensionality density-of-states can spans a wavelength range as small as 10 nm or as large as 500 nm. The specified range can be set at wavelengths between 0.4 micron to 2.0 micron, by using a GaAs substrate, an InP substrate, or another appropriate substrate, and by using $Al_{xw(1-kv)}Ga_{(1-xw)(1-xv)}In_{xv}As_{(1-xu)}P_{xu}$ semiconductor alloys and/or nitrogen containing alloys.

BRIEF DESCRIPTION OF DRAWINGS

The invention will now be described in more detail, by way of example, only with reference to the accompanying drawings, in which.

DETAILED DESCRIPTION OF THE PREFERRED EMBODIMENT

Figure 1:
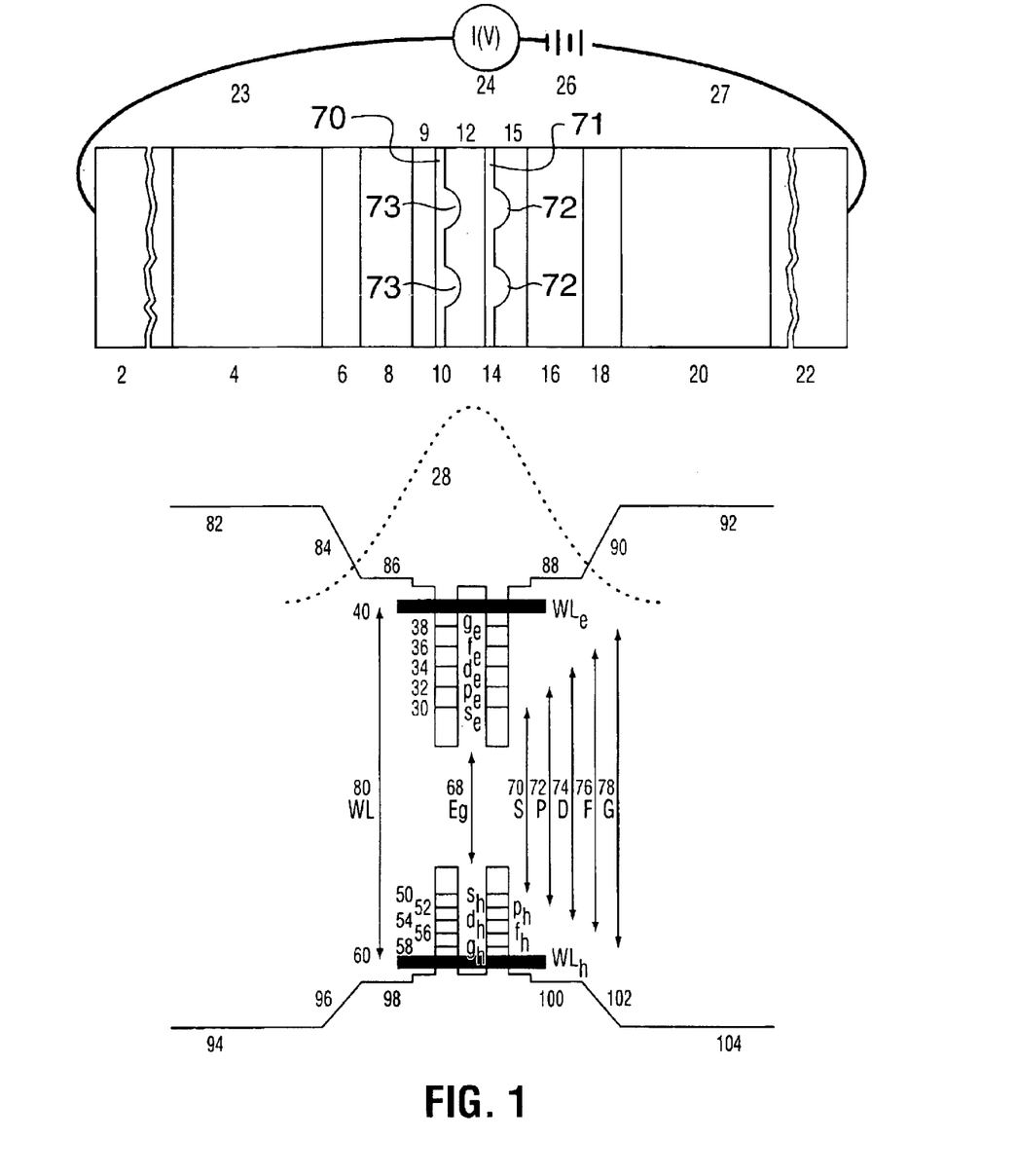
FIG. 1 is a partial, greatly magnified cross-section view of an example of a layer structure for a quantum dot laser diode, with a corresponding schematic of the energy level diagram depicting some of the transitions which can be used for the lasing.

FIG. 1 shows a schematic for the quantum dot laser diode portion of the QD-TEC laser in accordance with the invention. Such a diode comprises multiple layers of semiconductor materials which are depicted in the upper part of FIG. 1, together with the corresponding energy band diagram shown in the lower part of FIG. 1. In the band diagram, the vertical direction represents the energy of the carriers in the structure, and the horizontal direction represents the position of the carriers within the laser structure. The quantum dot layers 10, 14 are very thin; for instance in a preferred form of the device, the thickness of a quantum dot 72, 73 together with the wetting layer 71, 70 which forms below the quantum dots 72, 73 is about 4.5 nanometers or smaller. Hence, it is necessary to provide a substrate to grow the layers and to give structural integrity to the device. The substrate can be electrically conducting or insulating, and will typically have a thickness between 0.1 and 1 mm. The substrate will preferably be covered with a buffer layer which also serves to initiate proper growth conditions during the epitaxy.

The layers include conducting semiconductor contact layers 2 and 22, on the outside of the structure, which serve as sources of charged carriers and are connected to an external source of electrical power 26 by using metal contacts (not shown) an wires 23 and 27 respectively. Lithography and etching techniques such as wet etchings or dry etchings after masks patterning are used to make the metal contacts to the contact layers. The contact layers 2 and 22 will preferably be doped to provide carriers and conductivity, and can be composed of many layers of varying thickness, composition, and doping profiles to optimize the semiconductor morphology and the device performance. For example, the substrate used for the epitaxial growth can be used as part of one of the contact layer. Also preferably, one side of the structure will be doped n-type with electrons whereas the other side will have to be doped with the opposite polarity, p-type with holes. In the case for which a doped substrate is used for the epitaxy and is part of the contact layer 2 or 22, then that contact layer will preferably be doped of the same type as the substrate, whereas the other contact layer will preferably be doped with the opposite type.

Next layers towards the inside of the structure are the electron and hole emitting layers 4 and 20. As in the case of the contact layers, the electron and hole emitting layers 4 and 20 will preferably be doped to provide carriers and for conductivity. The doping of layers 4 will preferably be of the same type as the one of layer 2, and similarly the doping of layers 20 will preferably be of the same type as the one of layer 22. They can also be composed of many layers of varying thickness, composition, and doping profiles to optimize the semiconductor morphology and the device performance, as well as to optimize confinement of the carrier injected electrically in the active region in the inside layers. The electron and hole emitting layer will therefore preferably have a high bandgap compare to the layers more toward the inside. The major features of the resulting band edge profiles are depicted in the energy diagram for layer 4 for the conduction band 82, and for the valence band 94. Similarly, the major feature of the band edge profiles are depicted for layer 20 for the conduction band 92, and for the valence band 104.

Intermediate layers 6 and 18 with chosen bandgap and doping can also be introduced between the active region and the emitter layers to tailor the optical guiding and the optical and electrical properties of the laser diode. A possible band edge configuration is depicted 84, 90, 96, 102. The composition and doping of the materials will be chosen so that the relative optical constants, bandgaps, and conductivity of the layers will establish an effective guiding of the optical modes in a cavity formed perpendicular to the plane of the layers, as well as efficient carrier injection when an electric field is applied with the proper forward-bias polarity (V) yielding an electrical current I(V) 24.

At the core of the structure, in the active region, is one or more quantum dot layers 10 and 14 (FIG. 1 illustrate the case where two layers are used), separated by barrier(s) 12, and confined on each side with barriers (9 and 8), and (15 and 16). The active region is preferably not doped to minimize loses of the guided optical modes 28, but low doping might be used to optimize some device performances such as modulation speed. Also preferably, the size and shape of the quantum dots, and the number of quantum dots per unit area are adjusted from the growth parameters in conjunction with the choice of quantum dot material (10, 14), of barrier materials (8, 9, 12, 15, 16), of the number of quantum dot layers, of external cavity parameters, and of wavelength-selective element to achieve the desired tuning range and while optimizing the lasing efficiency for the wavelengths of interest. Similarly, the choice of the barrier material. (8, 9, 12, 15, 16), the doping profiles, the potential height for the electron (86, 88) and for the holes (98, 100), and the thickness of the barriers (8, 9, 15, and 16) and the spacer layer (12) are adjusted in conjunction with the quantum dot size to set the gain spectrum of the QD laser diode, to select a balance the laser efficiency and modulation speed, and to achieve the desired growth mode in the self-assembling growth. For example, for multiple layers of quantum dots, very thin barriers 12 will result in coupled zero-dimensional states in vertically self-organized quantum dots, thicker barriers 12 will result in isolated zero-dimensional states in vertically self-organized quantum dots, and thick barriers 12 will result in isolated zero-dimensional states in uncorrelated independent quantum dot layers.

In particular, the amount of semiconductor material required to form the self-assembled quantum dots (72, 73, etc.) depends on the relative strain between the substrate and the quantum dots. The number of quantum dots per unit area can be adjusted by varying the amount of material deposited in the quantum dot layers. The size of the quantum dots can be adjusted from the substrate temperature used during the growth of each quantum dot layers. For example, in the exemplary embodiment, due to the small size of the quantum dots, quantum mechanics will dictate the values of energy levels (30, 32, 34, 36, 38, 50, 52, 54, 56, 58) localized in the low band gap material (68) by the barriers (9, 12, 15). The shape of the zero-dimensional potential gives rise to a series of discrete, atomic-like, energy levels for the electrons $s_e$, $p_e$, $d_e$, $f_e$, $g_e$ (30, 32, 34, 36, 38 respectively), and for the holes $s_h$, $p_h$, $d_h$, $f_h$, $g_h$ (50, 52, 54, 56, 58 respectively), below the wetting layer subband $WL_e$ (40) and $WL_h$ (60) for the electrons and holes respectively. For self-assembled quantum dots, the degeneracy of these levels is typically 2n where n is the index of the level with, n=1 for the ground state S, n=2 for the first excited state P, etc. where the factor of 2 comes from the spin degeneracy, and the factor n originates from the various allowed angular momentum. The self-assembled quantum dots effectively give a zero-dimensional potential with a quasi-parabolic confinement, and consequently the energy spacing between the adjacent levels (also called the intersublevel spacing) is roughly constant for the various levels.

The number of allowed energy levels and intersublevel spacing is determined by the shape and size of the quantum dot, the height of the confining potential between the barriers (9, 12, 15) and the quantum dot layers (10, 14), and by the carrier effective mass. Experimental assessment of these energy levels can be obtained independently by probing the interband transitions and observing the state filling in photoluminescence or electroluminescence. The carriers introduced by the carrier injection fill the quantum dot energy levels in accordance with the level degeneracy, a rule similar to the atomic Hund's rule for filling orbitals, and Coulomb interaction and renormalization energies. For example, first the ground states $s_e$ (30) or $s_h$ (50) can each accommodate 2 carriers, one spin up, and one spin down, then the first excited states $p_e$ (32) or $p_h$ (52) can accommodate 4 carriers 2 spin up and 2 spin down, etc. The total number of available states is therefore given by the number of states per QDs for the energy range of interest, taking into account the degeneracy of the levels, multiplied by the density of QD in the layers which can be varied between $10^8$ to $10^{10}$ cm$^{-2}$. This is typically about 2 orders of magnitude lower than for 2-dimensional quantum well structures, and therefore it is possible to saturate the states over a much wider energy range for the quantum dot laser diode.

Radiative recombination of the allowed 0-dimensional and 2-dimensional transitions between electrons and holes which occupy these states will yield photon emission. For example, in a simplified picture, the emission spectrum can preferably be classified as the S (70), P (72), D (74), F (76), G (78), and WL (80) transitions, as depicted in FIG. 1. The emission spectrum from a single quantum dot would therefore be principally a discrete set of very narrow emission lines. Exciton, multi-exciton, many carriers, and similar effects can also slightly perturbed the spectral position of these emission lines. Also, a quantum dot laser diode will preferably operate with many quantum dots (typically many millions) instead of a single quantum dot, each of which can be slightly different from the others because of inhomogeneous broadening during the self-assembled growth. These effects and the inhomogenous broadening are preferably adjusted to obtain an emission and gain spectrum which can continuously cover a wavelength range hundreds of nanometers wide from the S transition 70 to the WL transition 80 (see below FIGS. 3 and 4). The reduced zero-dimensional density-of-states of the quantum dots will allow to saturate the lower states and to obtain lacing in the upper transition at shorter wavelength as well as for the lower states at longer wavelengths by varying the wavelength-selective element of the QD-TEC laser.

As mentioned above, in a preferred form of the invention the layers of the semiconductor materials are grown on a substrate from materials consisting essentially of gallium, indium, aluminum, arsenic, phosphorous, and possibly nitrogen, using known techniques such as molecular beam epitaxy, or metalorganic chemical vapor deposition, or chemical beam epitaxy, with dopant such as silicon, beryllium, or others. On GaAs substrates, the quantum dot material can be InGaAs, AlInAs, InP, or other alloys of AlGaInAsP, with barriers of AlGaAs or AlGaInP. On InP substrate, the quantum dot material can be InGaAs. Alloys with nitrogen can be used with the above III–V in cases where different band gap materials are desirable. On group IV substrates, Si can be used for the barrier, with some of the III–V mentioned above for the quantum dot material.

In fabricating the laser diode, a barrier material and an active quantum dot material are first selected such that the degree of lattice-mismatch dictates a critical thickness required to obtain spontaneous island formation, and the bandgap difference determines a possible number of confined states in conjunction with the energy spectrum of the low-dimensional states.

Next some thickness of the barrier material is grown in the active region between the electron emitting layer and the hole emitting layer on a substrate. The electron and hole emitting layers are chosen to have a lattice constant close to that of the substrate.

The quantum dot material is grown at a specified growth rate at a temperature which will produce quantum dots having the appropriate size and shape to obtain said low-dimensionality density-of-states. This growth is then stopped after the desired number of quantum dot per unit area is reached. Then, one waits a specified amount of time to allow for the self-assembling growth to form the quantum dots in shapes and sizes which will give the low-dimensionality density-of-states.

Finally some thickness of said barrier material is grown to cover the quantum dots and return to a planar growth front at a substrate temperature which may be varied during the growth and which will optimize the quality of the quantum dots.

The last steps may be repeated as necessary to build up multiple quantum layers.

In the exemplary embodiment of the invention, the substrate is GaAs; the quantum dot layers (10, 14, etc) consist essentially of $In_{x1}Ga_{1-x1}As$ wherein x1 equals 0.15 to 1, preferably about 0.5 to 1 and specifically 1; the barriers (8, 16) consists of $Al_{x2}Ga_{1-x2}As$ with x2 equals to 0 to 1, preferably about 0 to 0.4, and specifically 0.33; the barriers (9, 12, 15, etc) consists of $Al_{x2}Ga_{1-x2}As$ with x2 equals to 0 to 1, preferably about 0 to 0.4, and specifically 0. The electron and hole emitting layers are preferably doped n-type and p-type respectively, and made of $Al_{x3}Ga_{1-x3}As$ with x3 equals to 0.1 to 1, preferably about 0.3 to 0.8, and specifically 0.7. Intermediate layers 6 an 18 are used in the exemplary embodiment using composition profiles gradually going from the composition of the electron and hole emitting layers 4, 20 to the one of the barriers 8, 16.

The selected parameters will preferably result in materials having an effectively higher index of refraction and lower bandgap in the active region (8, 9, 10, 12, 14, 15, 16) to confine the carriers and the optical wave together in the gain region. The size/shape and composition of the quantum dots, and the thickness and height of the barriers, is selected to obtain the desired 0-dimensional density-of-state and gain spectrum for the QD-TEC laser. In the exemplary embodiment of the invention, the substrate is doped n-type and part of the contact layer 2, the carriers for the electron emitting layers 4 are provided by silicon doping, the bandgap and the doping is reduced in the intermediate layer 6 as shown by 84, 96, the active region is not doped, and a similar scheme is use for the intermediate layer 18, the hole emitting layer 20 and the contact layer 22 but using beryllium doping to provide the carriers.

Figure 2:
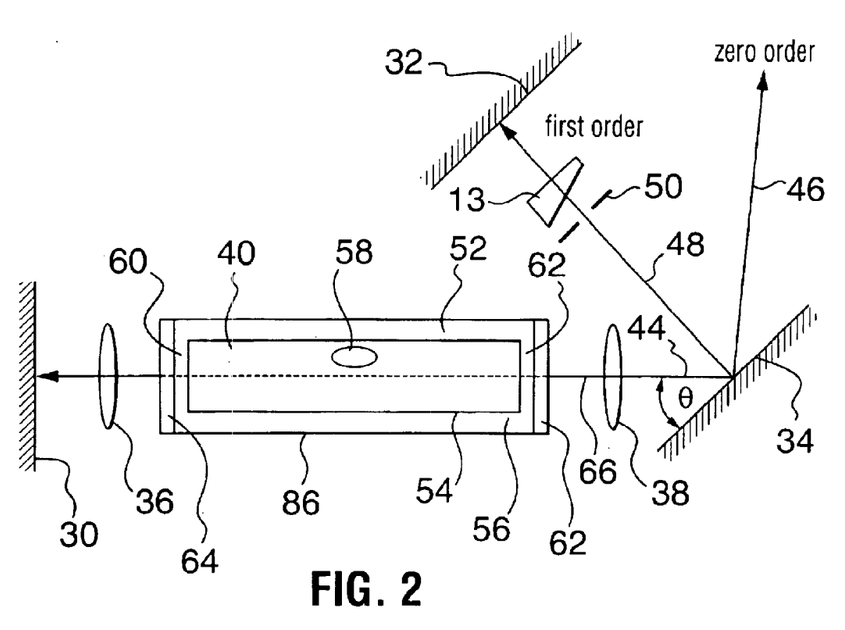
FIG. 2 is a top-view schematic of the principal elements of a QD-TEC laser giving an example for one of the possible configurations.

FIG. 2 illustrates an example of how an external cavity and a wavelength-selective element can be configured to tune the output wavelength of the QD-TEC laser. The quantum dot laser diode 86 is aligned between reflectors 30 and 32, the wavelength-selective element 34 discriminate the optical path of the various wavelengths. Optical elements 86, 38 can also be used to determine the beam path outside the laser diode cavity 40, and to initiate the waveguiding inside the laser diode cavity 40. Several configurations are possible, but FIG. 2 exemplifies one of the possible embodiments using a diffraction grating for the wavelength-selective element 34. For such an embodiment, the optical element 86, 38 will preferably be lenses used to provide the desired optical characteristic and mode profiling functions, and to collimate the photons existing the laser diode. One side of the collimated beam 44 is incident on the diffraction grating 34 and at an angle θ The grating then disperses the light mainly in a preferred intensity ratio between a zero-order diffraction 46 and a first-order diffraction 48. The wavelength in the zero-order diffraction are not dispersed and this beam 46 can be used as the (or one of the) output beam of the QD-TEC laser. The wavelengths in the first order beam 48 are dispersed in space and a spatial filter 50 can be used to let only the desired wavelengths resonate in the cavity. The wavelength tuning can be achieved by turning the grating angle θ or preferably by displacing the spatial filter 50, either of which will vary the wavelength bandpass which is allow to resonate in the cavity. The adjustment of the tuning element can be made with the help of some mechanical components or some electro-optical actuating devices which can be calibrated and/or computerized.

The current injection and the optical mode guided inside the QD laser diode material are preferably confined laterally 52, 54 to tailor the electrical, thermal, and optical characteristic of the QD-TEC laser. This can be achieved with lithography and etching techniques such as wet etchings or dry etchings after masks patterning which are used to make the metal contacts 56, 58 to the contact layers. The current injection in the QD laser diode material might preferably be confined longitudinally 60, 62 to tailor the electrical, thermal, and optical characteristic of the QD-TEC laser. The longitudinal confinement of the optical mode guided in the QD laser diode material is preferably adjusted by changing the reflectivity of a front 62 and a back 64 facet individually to tailor the electrical, thermal, and optical characteristic of the QD-TEC laser. A longitudinal mode regulator 13 can be adjusted to match a proper cavity mode for the selected wavelengths.

It might also be preferable to regulate the temperature and/or remove excess heat generated by the operation of the QD laser diode with the help of a temperature regulating device. Also, obviously the various component layers (2, 4, 6, 8, 10, 12, 14, etc.) are aligned and fixed in space on a rigid and stable platform which is designed with the proper adjustments and mechanisms for moving the parts which are displaced during the tuning of the QD-TEC laser.

Also as mentioned above, FIG. 2 exemplifies one of the many possible embodiments, and for example in some embodiments, it might be preferable to build the wavelength-selective tuning element integrated to the QD laser diode by using lithography techniques to produce gratings directly on the semiconductor, and which could be tuned using electric fields and/or currents in part of the device. Also, in some embodiments, it might be preferable to build part of the external cavity integrated to the QD laser diode and/or to the wavelength selective tuning element. For example, the reflector 30 and the optical element 86 are preferably eliminated by producing a reflector with the appropriate optical properties directly on the laser diode facet 64 using a combination of deposited thin films. Similarly the optical properties of the facet 62 can be adjusted by depositing thin films to optimize the device performance. Also the reflector 32 can be eliminated by folding the first order beam 48 directly back on the laser diode beam 66. The preferred geometry and the optical properties of the various elements will be dependent of the desired tuning range and power, and the desired spatial, temporal, and spectral mode profile for the QD-TEC laser. For example, the reflectivity and the transmission spectra of the reflector 30 and 32, and/or of the facet 60 and 62, as well as the grazing angle of the grating 34, will have to be adjusted according to the wavelength range of the QD-TEC laser.

Figure 3:
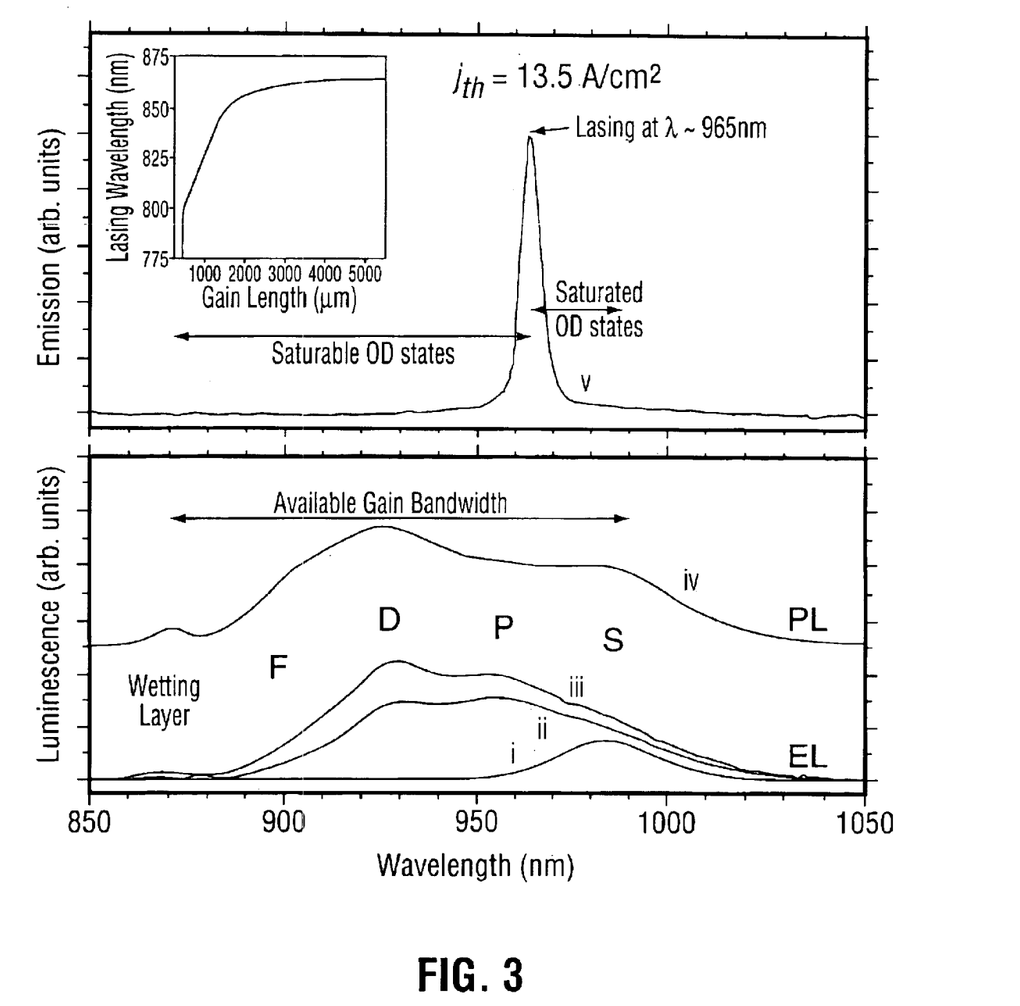
FIG. 3 is an example of spectrum obtained with a quantum dot laser demonstrating lasing at lambda ~965 nm, in the lower zero-dimensional states, at a wavelength about one hundred nanometers away for the shortest achievable wavelength which would correspond to the wetting layer transitions as shown in FIG. 4. The inset demonstrates the tuning achieved between 880 nm and 965 nm.

FIG. 3 demonstrates the case for a quantum dot laser diode having seven layers of InAs quantum dots (72, 73, etc.) with GaAs barriers (9, 12, 15, etc.), with $Al_{0.35}Ga_{0.65}As$ barriers (8, 16), and with $Al_{0.7}Ga_{0.3}As$ electron (4) and hole (20) emitting layers barriers, grown on a GaAs substrate which is part of the contact layer 30. For this example, the metal contact (58 in FIG. 2) is 60 micron wide and 5 mm long on top of GaAs contact layer (22). Cleaved facets with no facet coatings (60 and 62 in FIG. 2) are used here. The resulting 0-dimensional transition (S, P, D, F, and WL) can be observed at the bottom of FIG. 3 in the electroluminescence (EL) and photoluminescence (PL) spectra obtained at different excitation intensity and current. The top of the FIG. 3 demonstrates lasing at lambda ~965 nm, in the lower zero-dimensional states, at a wavelength about one hundred nanometers away for the shortest achievable wavelength which would correspond to the wetting layer (WL) transitions. The threshold current density to obtain lasing in this case is 13.5 $A/cm^2$, resulting in a range of saturated zero-dimensional states, and a range of saturable zero-dimensional states as indicated.

Figure 4:
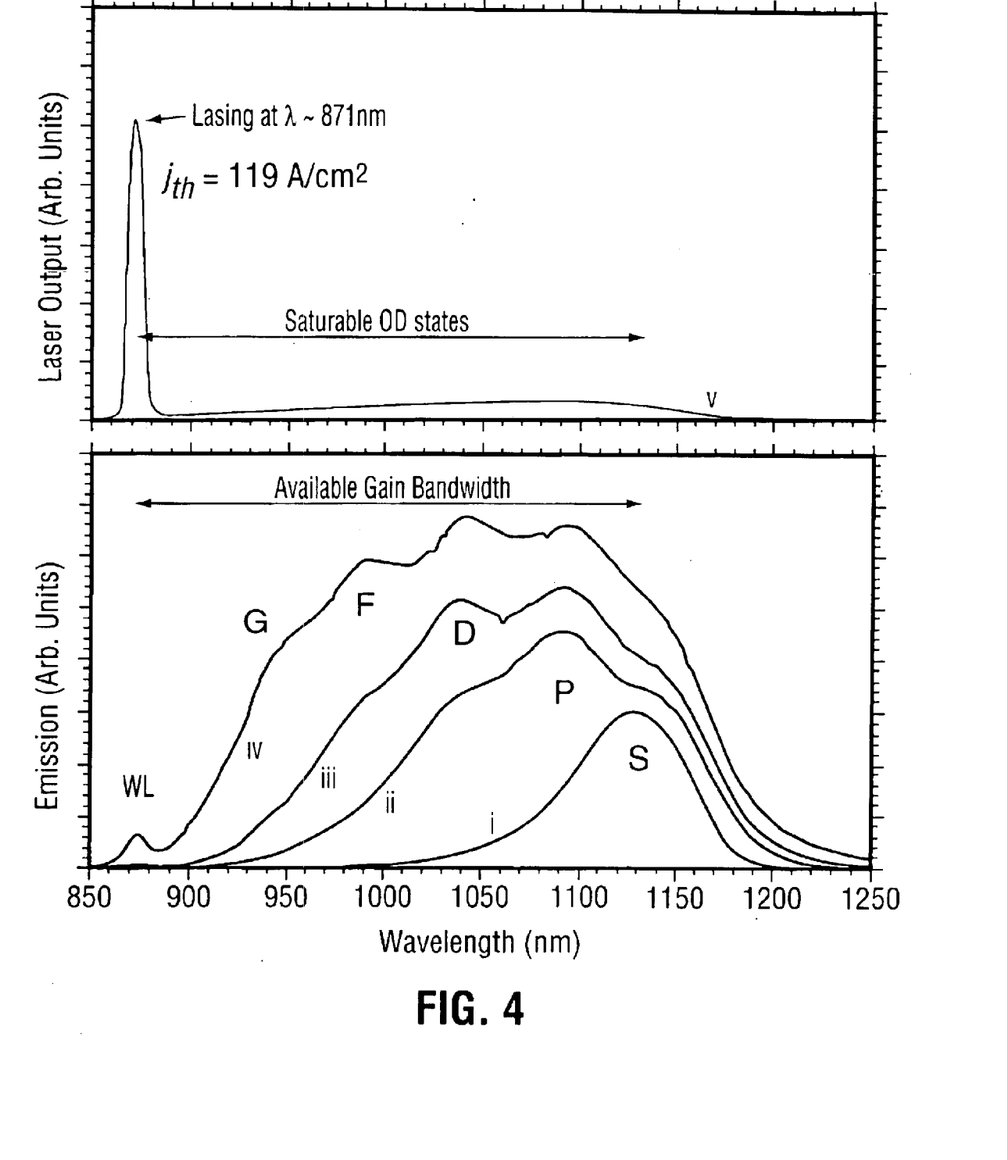
FIG. 4 is an example of spectrum obtained with a quantum dot laser demonstrating the complete saturation of all the zero-dimensional states over a wavelength range of hundreds of nanometers and with lasing on a wetting layer transition at lambda ~865 nm.

A QD-TEC laser based on such a quantum dot laser would benefit from a gain spectrum about 100 nm wide and its output could be tune over that range. For example, the inset shows tuning between 880 nm and 965 nm obtained by changing the length of the laser diode cavity. FIG. 4 shows a similar quantum dot laser where only one layer of quantum dot was used, and where the size and shape of the quantum dot was changed. It results in a wavelength range of ~260 nm between the S and WL transition. The complete saturation of all zero-dimensional states over about 260 nm is demonstrated with lasing at 871 nm close to the WL transition (curve v of FIG. 4). A QD-TEC laser based on such a quantum dot laser would benefit from a gain bandwidth about 260 nm wide and its output could be tune over that range by using wideband optics and reflectors.

The QD-TEC laser is based on low-dimensional, such as zero-dimensional heterostructures (i.e. quantum dots) and can benefit from the properties unique to quantum dots. One obvious advantage gained from using quantum dots is that the QD-TEC laser is tunable over wide ranges of wavelengths. However, one-dimensional heterostructures, i.e. quantum wires can also be used to advantage. The self-assembled growth method used offers a wide range of possible materials with large lattice mismatched between the semiconductors, therefore increasing the choice of available material for fabrication and thus the available emission spectra. In addition, the QD-TEC laser will have good efficiency because it is based on semiconductor laser diode technology.

The tunable lasing range of the described laser may be in the visible red region, or the near infrared region of the spectrum. For example, the tunable lasing range may be in the region of the spectrum close to 1.3 micron, in the region of the spectrum close to 1.4–1.7 micron, in parts or the complete spectral region between 0.6 to 2.0 microns, or in parts or the complete spectral region between 0.3 to 2.5 microns.

The external cavity, and/or the said low dimensionality laser diode, and/or the said wavelength-selective element can be adapted to be with high modulation speed or to be used mode-locked.

Whereas particular embodiments of the invention have been described for purposes of illustration, it will be evident to those skilled in the art that numerous variations of the details may be made without departing from the invention.

I claim:

1. A tunable laser system comprising:
   a laser diode for generating laser light from an active region comprising a multitude of self-assembled low dimensional quantum structures organized collectively to have an emission and gain spectrum extending continuously over a wavelength range of at least one hundred nanometers, said quantum structures being selected from the group consisting of quantum dots and quantum wires;
   a wavelength-selective element for selecting a wavelength of interest emitted by said laser diode; and
   an external cavity resonant at a wavelength selected by said wavelength-selective element so that the active region of said laser diode generates said laser light at said selected wavelength.

2. The laser system of claim 1, wherein said low dimensional quantum structures are zero-dimensional or quasi-zero-dimensional (quantum dot) structures.

3. The laser system of claim 1, wherein said low dimensional quantum structures are one-dimensional (quantum wire) structures.

4. The laser system of claim 3, wherein said one-dimensional or quasi-one-dimensional structures are obtained with coupled zero-dimensional structures.

5. The laser system of claim 1, wherein said low-dimensional structures are quantum dots obtained by spontaneous island formation during epitaxy of highly strained semiconductors.

6. The laser system of claim 5, further comprising a wetting layer underneath said low dimensional structures arranged such that energy levels in said low dimensional structures lie below a subband in said wetting layer.

7. The laser system of claim 6, wherein all or a part of the spectral region comprised between the emission of the said wetting layer and the emission of the lowest energy low-dimensional level is tunable for lasing by selecting a parameter selected from the group consisting of: parameters which control the level of saturation or the optical gain.

8. The laser system of claim 7, wherein said laser diode further comprises an electron emitting layer, a hole emitting layer, a series of quantum dot layers in an active region disposed between said electron and hole emitting layers, barrier layers separating each quantum dot layer, and wherein intermediate layers between the said active region and the said electron and hole emitting layers are provided to tailor the optical and electrical properties of the low dimensionality laser diode to specific requirements.

9. The laser system of claim 8, wherein said layers forming the laser diode consist mainly of gallium, indium, aluminum, arsenic, nitrogen, and phosphorus.

10. The laser system of claim 8, wherein said layers forming the laser diode consist essentially of $Al_{x3(1-x2)}Ga_{(1-x3)(1-x2)}In_{x2}As_{1-x1}P_{x1}$ for the electron and hole emitting layers, $Al_{x6(1-x5)}Ga_{(1-x6)(1-x5)}In_{x5}As_{1-x4}P_{x4}$ for the active region, and $Al_{x9(1-x8)}Ga_{(1-x9)(1-x8)}In_{x2}As_{1-x7}P_{x7}$ for the barrier layers.

11. The laser system of claim 10, wherein the layers are grown on a GaAs substrate, and where x1 and x2 equal about 0, x3 equals between 0.3 to 0.8; x4 and x6 equal about 0, x5 equals between 0.3 and 1; x9 equals between 0 to 0.3 and x7 and x8 equals about 0.

12. The laser system of claim 10, wherein the layers are grown on GaAs substrates, and where x1 and x2 equal about 0, x3 equals between 0.3 to 0.8; x4 equals about 0, x6 equals about 1, x5 equals between 0.4 and 1; x9 equals between 0.1 to 0.4, and x7 and x8 equal about 0.

13. The laser system of claim 10, wherein the layers are grown on GaAs substrates, where x3 equals about 0, x1 equals about 1, and x2 is such that this alloy is close to being lattice-matched to GaAs, x4 and x6 equal about 0, x5 equals between 0.3 and 1; x7, x8, and x9 equal about 0.

14. The laser system of claim 10, wherein he layers are grown on GaAs substrates, where x3 equals about 0, x1 equals about 1, and x2 is such that this alloy is close to being lattice-matched to GaAs, x4 and x5 equal about 1, x6 equals about 0; x9 equal about 0, and x7 and x8 are such that this alloy is close to being lattice-matched to GaAs.

15. The laser system of claim 10, wherein the layers are grown on InP substrates, where x1 equals about 0, x2 equals about 0.52, x3 equals about 1; x4 and x6 equal about 0, x5 equals between 0.6 and 1; x9 equals between 0 to 0.5, x7 equals about 0, and x8 equal about 0.52.

16. The laser system of claim 10 wherein the layers are grown on InP substrates, where x1 equals about 0, x2 equals about 0.52, x3 equals about 1; x4 and x6 equal about 0, x5 equals between 0.6 and 1; x7, x8 and x9 are adjusted to form a quaternary alloy close to lattice-matched on InP with the desired bandgap.

17. The laser system of claim 10, where said wavelength-selective element used to tune the laser output consists of an element selected from the group consisting of: a diffraction grating, a prism, a birefringent element, an etalon, and a dispersive element.

18. The laser system of claim 17, wherein said external cavity is defined between a pair of mirrors with appropriate reflectance, and said wavelength-selective element acts as an output-coupler of light from said laser diode into said external cavity.

19. The laser system of claim 18, wherein one or more of said mirrors is selected from a group consisting of: a facet of said laser diode, or the wavelength-selective element which can also act as an output coupler.

20. The laser system of claim 18, further comprising optical and spatial filters in said external cavity.

* * * * *